(12) United States Patent
Wang et al.

(10) Patent No.: US 12,193,315 B2
(45) Date of Patent: Jan. 7, 2025

(54) FLEXIBLE DISPLAY PANEL, METHOD FOR FORMING THE SAME AND ADHESIVE APPLICATION DEVICE FOR THE METHOD

(71) Applicants: Chengdu BOE Optoelectronics Technology Co., Ltd., Sichuan (CN); BOE Technology Group Co., Ltd., Beijing (CN)

(72) Inventors: Yaming Wang, Beijing (CN); Jia Deng, Beijing (CN); Haitao Liang, Beijing (CN); Dongdong Zhao, Beijing (CN); Mingqi Gang, Beijing (CN); Shaoxiong Zhang, Beijing (CN); Jialin Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 477 days.

(21) Appl. No.: 17/552,312

(22) Filed: Dec. 15, 2021

(65) Prior Publication Data
US 2022/0238820 A1 Jul. 28, 2022

(30) Foreign Application Priority Data
Jan. 28, 2021 (CN) .......................... 202110116426.3

(51) Int. Cl.
*H10K 77/10* (2023.01)
*B32B 7/12* (2006.01)
(Continued)

(52) U.S. Cl.
CPC .............. *H10K 77/111* (2023.02); *B32B 7/12* (2013.01); *B32B 37/1292* (2013.01);
(Continued)

(58) Field of Classification Search
CPC ... B32B 37/1292; B32B 7/12; B32B 2307/42; B32B 2457/20; B32B 2307/30;
(Continued)

(56) References Cited

U.S. PATENT DOCUMENTS 9,363,342 B2 * 6/2016 Shin ...................... G06F 1/1637
9,568,800 B1 * 2/2017 Sprague .............. G02F 1/16753
(Continued)

FOREIGN PATENT DOCUMENTS

| CN | 110010013 A | 7/2019 |
| CN | 111785167 A | 10/2020 |
| JP | 2014013422 A | 1/2014 |

OTHER PUBLICATIONS

CN 202110116426.3 first office action.

*Primary Examiner* — Mouloucoulaye Inoussa
(74) *Attorney, Agent, or Firm* — IPro, PLLC

(57) ABSTRACT

The present disclosure provides a flexible display panel, a method for forming the flexible display panel and an adhesive application device for the method. The flexible display panel includes a cover plate layer and a screen film layer. The screen film layer includes a plurality of film layers laminated one on another at one side of the cover plate layer, and an adhesive is filled into a gap between an edge of an outermost film layer of the screen film layer relative to the cover plate layer and the cover plate layer.

15 Claims, 7 Drawing Sheets

(51) Int. Cl.
*B32B 37/12* (2006.01)
*H10K 50/86* (2023.01)
*H10K 50/87* (2023.01)
*H10K 71/00* (2023.01)
*H10K 102/00* (2023.01)

(52) U.S. Cl.
CPC ............ *H10K 50/86* (2023.02); *H10K 50/87* (2023.02); *H10K 71/00* (2023.02); *B32B 2307/30* (2013.01); *B32B 2307/42* (2013.01); *B32B 2457/20* (2013.01); *H10K 2102/311* (2023.02)

(58) Field of Classification Search
CPC .... H10K 50/87; H10K 50/844; H10K 77/111; H10K 71/00; H10K 50/86; H10K 50/8426; H10K 59/18; H10K 59/131; H10K 2102/311; G02B 5/3033; G02F 1/133305; G02F 1/13336; G02F 1/133308; G02F 1/133314; G02F 1/133331; G02F 1/133322; G02F 1/133325; G02F 1/13452; G02F 1/13454; G02F 2202/28; Y02E 10/549; G06F 1/1656; G06F 3/0412; G06F 1/203; G06F 1/1643; G06F 1/206; G06F 1/1637; G06F 1/1601; G06F 3/0488; G06F 1/20; G06F 1/182; G06F 1/163; G06F 1/1652; H04M 1/0266; H05K 5/0017; G09F 9/301
See application file for complete search history.

(56) References Cited

U.S. PATENT DOCUMENTS

| | | | | |
|---|---|---|---|---|
| 9,989,790 | B2 * | 6/2018 | Yang | G02F 1/133305 |
| 10,105,943 | B2 * | 10/2018 | Kim | B32B 38/1841 |
| 10,212,865 | B2 * | 2/2019 | Son | H05K 5/0017 |
| 10,509,439 | B2 * | 12/2019 | Choi | G06F 1/1652 |
| 10,680,210 | B2 * | 6/2020 | Lee | H10K 50/84 |
| 10,735,569 | B2 * | 8/2020 | Lynch | H04M 1/0269 |
| 10,756,295 | B2 * | 8/2020 | Jiang | G06F 1/1626 |
| 10,908,340 | B2 * | 2/2021 | Namkung | H10K 50/84 |
| 11,221,645 | B2 * | 1/2022 | Won | B32B 38/1866 |
| 11,275,409 | B2 * | 3/2022 | Gao | G06F 1/1609 |
| 11,360,518 | B2 * | 6/2022 | Shin | G09F 9/301 |
| 11,450,824 | B2 * | 9/2022 | Kim | H10K 50/8426 |
| 11,493,963 | B2 * | 11/2022 | Chen | G06F 1/1652 |
| 11,508,941 | B2 * | 11/2022 | Kim | H10K 50/841 |
| 11,963,425 | B1 * | 4/2024 | Wittenberg | H10K 50/854 |
| 2011/0050657 | A1 * | 3/2011 | Yamada | H10K 59/18 361/679.01 |
| 2014/0002385 | A1 * | 1/2014 | Ka | H10K 77/111 345/173 |
| 2014/0104762 | A1 * | 4/2014 | Park | H05K 5/0217 361/679.01 |
| 2014/0132488 | A1 * | 5/2014 | Kim | G06F 1/1637 345/76 |
| 2014/0139984 | A1 * | 5/2014 | Jung | G06F 1/1601 361/679.01 |
| 2014/0306941 | A1 * | 10/2014 | Kim | H10K 59/131 345/204 |
| 2015/0334211 | A1 * | 11/2015 | Shin | G06F 1/1637 455/566 |
| 2016/0066440 | A1 * | 3/2016 | Choi | G06F 1/1601 361/679.3 |
| 2016/0299527 | A1 * | 10/2016 | Kwak | G06F 1/1626 |
| 2016/0307973 | A1 * | 10/2016 | Yang | H10K 50/84 |
| 2017/0072671 | A1 * | 3/2017 | Son | H10K 71/50 |
| 2017/0263492 | A1 * | 9/2017 | Son | H01L 21/67092 |
| 2018/0086034 | A1 * | 3/2018 | Lee | B32B 38/0004 |
| 2018/0202946 | A1 * | 7/2018 | Mishima | G06T 7/001 |
| 2018/0224688 | A1 * | 8/2018 | Chen | G02F 1/13454 |
| 2018/0259805 | A1 * | 9/2018 | Takehara | G02F 1/136209 |
| 2018/0364846 | A1 * | 12/2018 | Ahn | G06F 1/1656 |
| 2019/0006615 | A1 * | 1/2019 | Jung | H10K 59/40 |
| 2019/0018275 | A1 * | 1/2019 | Ochi | G06F 1/1637 |
| 2019/0067411 | A1 * | 2/2019 | Lee | H10K 77/111 |
| 2020/0009803 | A1 * | 1/2020 | Kang | B32B 3/04 |
| 2020/0073436 | A1 * | 3/2020 | Jang | H05K 5/064 |
| 2020/0203672 | A1 * | 6/2020 | Kuon | H10K 50/8426 |
| 2021/0234120 | A1 * | 7/2021 | Zhang | H10K 71/00 |
| 2021/0382337 | A1 * | 12/2021 | Wu | G02F 1/13452 |
| 2022/0011624 | A1 * | 1/2022 | Wu | G09F 9/301 |
| 2022/0019105 | A1 * | 1/2022 | Liu | G02F 1/133305 |
| 2022/0206538 | A1 * | 6/2022 | Liu | G06F 1/1652 |
| 2023/0026336 | A1 * | 1/2023 | Liu | B32B 17/06 |
| 2023/0356518 | A1 * | 11/2023 | Liu | B32B 38/0012 |

* cited by examiner

FLEXIBLE DISPLAY PANEL, METHOD FOR FORMING THE SAME AND ADHESIVE APPLICATION DEVICE FOR THE METHOD

CROSS-REFERENCE TO RELATED APPLICATION

This application claims a priority of the Chinese patent application No. 202110116426.3 filed on Jan. 28, 2021, which is incorporated herein by reference in its entirety.

TECHNICAL FIELD

The present disclosure relates to the field of display panel, in particular to a flexible display panel, a method for forming the flexible display panel and an adhesive application device for the method.

BACKGROUND

Along with the development of the display technology, an electronic product has gradually shown such a trend of being miniaturized, light and thin, and thereby an Organic Light-Emitting Diode (OLED) flexible display panel has been rapidly developed. As compared with a conventional flat-panel display, a most prominent advantage of a flexible display lies in that it has broken through an inherent concept of original two-dimension display, so the flexible display is capable of being applied to more aspect of living scenario and portable devices.

SUMMARY

In one aspect, the present disclosure provides in some embodiments a flexible display panel, including a cover plate layer and a screen film layer. The screen film layer includes a plurality of film layers laminated one on another at one side of the cover plate layer, and an adhesive is filled into a gap between an edge of an outermost film layer of the screen film layer relative to the cover plate layer and the cover plate layer.

In a possible embodiment of the present disclosure, the screen film layer comprises a first bending portion and a first non-bending portion, the cover plate layer comprises a second bending portion and a second non-bending portion, and an edge of the screen film layer and an edge of the cover plate layer are arranged adjacent to the first bending portion of the screen film layer and the second bending portion of the cover plate layer respectively.

In a possible embodiment of the present disclosure, projections of at least two film layers of the plurality of film layers onto the cover plate layer partially overlap each other.

In a possible embodiment of the present disclosure, the screen film layer includes a polarizer, a display film, a back film and a heat dissipation layer laminated one on another in a direction away from the cover plate layer, and the adhesive covers each of edges of the polarizer, the display film, the back film and the heat dissipation layer.

In a possible embodiment of the present disclosure, the screen film layer includes a polarizer, a display film and a back film laminated one on another in a direction away from the cover plate layer, and the adhesive is arranged between the back film and the cover plate layer and covers each of edges of the polarizer and the display film.

In a possible embodiment of the present disclosure, the screen film layer includes a polarizer, a display film, a back film and a heat dissipation layer laminated one on another in a direction away from the cover plate layer, and the adhesive is arranged between the heat dissipation layer and the cover plate layer and covers each of edges of the polarizer, the display film and the back film.

In another aspect, the present disclosure provides in some embodiments a method for forming a flexible display panel. The flexible display panel includes a cover plate layer and a screen film layer, and the screen film layer includes a plurality of film layers. The method includes: attaching the plurality of film layers sequentially onto one side of the cover plate layer; and applying an adhesive into a gap between an edge of an outermost film layer of the screen film layer relative to the cover plate layer and the cover plate layer.

In a possible embodiment of the present disclosure, subsequent to applying the adhesive into the gap between the edge of the outermost film layer of the screen film layer relative to the cover plate layer and the cover plate layer, the method further includes: bending the cover plate layer and the screen film layer. The bent screen film layer includes a first bending portion and a first non-bending portion, the bent cover plate layer includes a second bending portion and a second non-bending portion, and an edge of the screen film layer and an edge of the cover plate layer are arranged adjacent to the first bending portion of the screen film layer and the second bending portion of the cover plate layer respectively.

In a possible embodiment of the present disclosure, projections of at least two film layers of the plurality of film layers onto the cover plate layer partially overlap each other.

In a possible embodiment of the present disclosure, the screen film layer includes a polarizer, a display film, a back film and a heat dissipation layer laminated one on another in a direction away from the cover plate layer. The applying the adhesive into the gap between the edge of the outermost film layer of the screen film layer relative to the cover plate layer and the cover plate layer includes: applying the adhesive into a gap between an edge of the heat dissipation layer and the cover plate layer in such a manner that the adhesive covers each of edges of the polarizer, the display film, the back film and the heat dissipation layer.

In a possible embodiment of the present disclosure, the screen film layer includes a polarizer, a display film and a back film laminated one on another in a direction away from the cover plate layer. The applying the adhesive into the gap between the edge of the outermost film layer of the screen film layer relative to the cover plate layer and the cover plate layer includes: applying the adhesive into a gap between an edge of the back film and the cover plate layer in such a manner that the adhesive covers each of edges of the polarizer and the display film. The screen film layer further includes a heat dissipation layer, and the method further includes attaching the heat dissipation layer onto a side of the back film away from the cover plate layer.

In a possible embodiment of the present disclosure, the screen film layer includes a polarizer, a display film and a back film laminated one on another in a direction away from the cover plate layer. The applying the adhesive into the gap between the edge of the outermost film layer of the screen film layer relative to the cover plate layer and the cover plate layer includes: applying the adhesive into a gap between an edge of the back film and the cover plate layer in such a manner that the adhesive covers each of edges of the polarizer, the display film and the back film. The screen film layer further includes a heat dissipation layer, and the method further includes attaching the heat dissipation layer onto a side of the back film away from the cover plate layer in such a manner that the adhesive is arranged between the heat dissipation layer and the cover plate layer.

In a possible embodiment of the present disclosure, after the application of the adhesive, the method further includes irradiating the adhesive with ultraviolet.

In yet another aspect, the present disclosure provides in some embodiments an adhesive application device for a method for forming a flexible display panel. The flexible display panel includes a cover plate layer and a screen film layer, and the screen film layer includes a plurality of film layers laminated one on another at one side of the cover plate layer. The adhesive application device includes a position capturing unit and an adhesive application mechanism. The position capturing unit is configured to obtain position information about an edge of an outermost film layer of the screen film layer relative to the cover plate layer and directly or indirectly transmit the position information to the adhesive application mechanism. The adhesive application mechanism is configured to apply an adhesive into a gap between the edge of the outermost film layer of the screen film layer relative to the cover plate layer and the cover plate layer.

In a possible embodiment of the present disclosure, when a bending angle at a bending portion of the flexible display panel is smaller than or equal to 90°, the position capturing unit is directly aligned with the edge of the outermost film layer of the screen film layer relative to the cover plate layer to capture the position information about the edge of the outermost film layer of the screen film layer relative to the cover plate layer.

In a possible embodiment of the present disclosure, when a bending angle at a bending portion of the flexible display panel is 180°, the position capturing unit is configured to capture the position information about the edge of the outermost film layer of the screen film layer relative to the cover plate layer through a reflector.

In a possible embodiment of the present disclosure, when a bending angle at a bending portion of the flexible display panel is greater than 90° and smaller than 180°, the position capturing unit is directly aligned with the edge of the screen film layer to capture the position information about the edge of the outermost film layer of the screen film layer relative to the cover plate layer, or the position capturing unit is configured to capture the position information about the edge of the outermost film layer of the screen film layer relative to the cover plate layer through a reflector.

In a possible embodiment of the present disclosure, the reflector has a planar or curved surface, or a surface having at least two linear portions.

In a possible embodiment of the present disclosure, the adhesive application mechanism is a one-piece or split-type mechanism.

The other aspects and the advantages of the present disclosure will be given as follows, or will become more apparent, or will be understood through practices.

DETAILED DESCRIPTION

Figure 1:
FIG. 1 is a schematic view showing a flexible display panel according to one embodiment of the present disclosure.

The present disclosure will be described hereinafter in conjunction with the embodiments and the drawings. Identical or similar reference numbers in the drawings represent an identical or similar element or elements having an identical or similar function. The following embodiments are for illustrative purposes only, but shall not be used to limit the scope of the present disclosure.

In the embodiments of the present disclosure, it should be appreciated that, such words as "longitudinal", "lateral", "length", "width", "thickness", "on/above", "under/below", "front", "back", "left", "right", "vertical", "horizontal", "top", "bottom", "inside" and "outside" may be used to indicate directions or positions as viewed in the drawings, and they are merely used to facilitate the description in the present disclosure, rather than to indicate or imply that a device or member must be arranged or operated at a specific position.

Unless otherwise specified, such words as "arrange", "connect", "couple" and "fix" may have a general meaning, e.g., the word "connect" may refer to fixed connection, removable connection or integral connection, or mechanical or electrical connection, or direct connection or indirect connection via an intermediate component, or communication between two components, or an interaction relationship between two components. The meanings of these words may be understood by a person skilled in the art in accordance with the practical applications.

In the related art, an OLED device is susceptible to moisture and oxygen, and thereby pixels are damaged and its service life is shortened. Through an encapsulation technique, it is able to protect the OLED device from moisture and oxygen. After a screen is bent to be attached onto a surface of a glass cover plate, such film layers as a polarizer, a display film and a back film are harder to be deformed due to tension and compression as compared with adhesive layers therebetween. In addition, these film layers are bent at different bending radiuses. Hence, when the polarizer, the display film and the back film are bent, misplacement may occur. At this time, a gap is formed between the outermost back film and the glass cover plate, and thereby an overhanging structure is formed. When an edge of the screen is pressed, it is easily bent to generate cracks. The cracks at the film layers extend to the display area, and thereby an encapsulation layer is damaged.

The present disclosure provides in some embodiments a flexible display panel 10, a method for forming the flexible display panel 10 and an adhesive application device for the method, which will be described hereinafter in conjunction with FIGS. 1 to 21.

Figure 2:
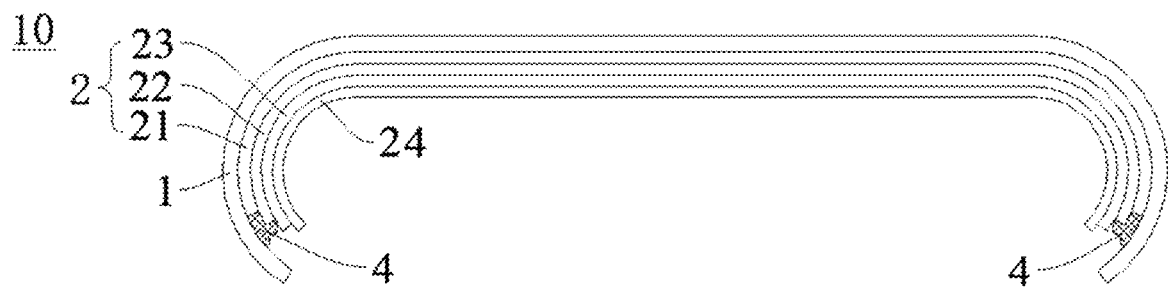
FIG. 2 is another schematic view showing the flexible display panel according to one embodiment of the present disclosure.
Figure 3:
FIG. 3 is yet another schematic view showing the flexible display panel according to one embodiment of the present disclosure.

As shown in FIGS. 1 to 3, the flexible display panel 10 in the embodiments of the present disclosure includes a cover plate layer 1 and a screen film layer 2. The screen film layer 2 includes a plurality of film layers laminated one on another at one side of the cover plate layer 1. An adhesive 4 is filled into a gap between an edge of an outermost film layer (e.g., a heat dissipation layer 24 in FIGS. 1 to 3) of the screen film layer 2 relative to the cover plate layer and the cover plate layer 1.

Generally, there is the gap between the edge of the outermost film layer of the screen film layer 2 and the cover plate layer 1, and the adhesive 4 is filled into the gap so as to provide a support. In this way, even when the flexible display panel 10 is bent, it is less likely to generate the cracks at an edge of the screen film layer 2, and thereby it is able to prevent the encapsulation layer from being damaged.

According to the flexible display panel 10 in the embodiments of the present disclosure, the edge of the screen film layer 2 is supported by the adhesive 4, so it is able to avoid the formation of the overhanging structure between the edge of the screen film layer 2 (especially the edge of the outermost film layer of the screen film layer 2) and the cover plate layer 1, and reinforce the connection between film layers of the flexible display panel 10, thereby to reduce the probability of cracks generated when bending the edge of the screen.

As shown in FIGS. 1 to 3, the screen film layer comprises a first bending portion and a first non-bending portion, the cover plate layer comprises a second bending portion and a second non-bending portion, and the edge of the screen film layer 2 and an edge of the cover plate layer 1 are arranged adjacent to the first bending portion of the screen film layer 2 and the second bending portion of the cover plate layer 1 respectively. It should be appreciated that, in the case that the screen film layer includes the plurality of film layers, the edge of the screen film layer refer to edges of the plurality of film layers including the edge of the outermost film layer of the screen film layer relative to the cover plate layer.

As shown in FIGS. 1 to 3, projections of at least two film layers of the plurality of film layers onto the cover plate layer 1 partially overlap each other. It should be appreciated that projections of at least two film layers onto the second bending portion of the cover plate layer 1 refer to projections of at least two film layers onto the second bending portion of the cover plate layer 1 along a normal direction of the second bending portion.

As shown in FIG. 1, the screen film layer 2 includes a polarizer 21, a display film 22, a back film 23 and a heat dissipation layer 24 laminated one on another in a direction away from the cover plate layer 1, and the adhesive 4 covers each of edges of the polarizer 21, the display film 22, the back film 23 and the heat dissipation layer 24.

As shown in FIGS. 1 to 3, the polarizer 21 is arranged adjacent to the cover plate layer 1, the back film 23 is arranged away from the cover plate layer 1, the display film 22 is arranged between the polarizer 21 and the back film 23, and the heat dissipation layer 24 is arranged at a side of the back film 23 away from the cover plate layer 1.

Based on the above, it is able to support, through the adhesive 4, the edges of the screen film layer 2 and the heat dissipation layer 24 in a better manner, and improve the connection between the cover plate layer 1 and the screen film layer 2 and between the screen film layer 2 and the heat dissipation layer 24.

As shown in FIG. 2, the screen film layer 2 includes a polarizer 21, a display film 22 and a back film 23 laminated one on another in a direction away from the cover plate layer 1, and the adhesive 4 is arranged between the back film 23 and the cover plate layer 1 and covers each of edges of the polarizer 21 and the display film 22.

Based on the above, it is able to support, through the adhesive 4, the edges of the polarizer 21 and the display film 22 in a better manner, and improve the connection between the cover plate layer 1 and the polarizer 21 and between the polarizer 21 and the display film 22.

As shown in FIG. 3, the screen film layer 2 includes a polarizer 21, a display film 22, a back film 23 and a heat dissipation layer 24 laminated one on another in a direction away from the cover plate layer 1, and the adhesive 4 is arranged between the heat dissipation layer 24 and the cover plate layer 1 and covers each of edges of the polarizer 21, the display film 22 and the back film 23.

Based on the above, it is able to support, through the adhesive 4, the edges of the polarizer 21, the display film 22 and the back film 23 in a better manner, and improve the connection between the cover plate layer 1 and the polarizer 21, between the polarizer 21 and the display film 22, and between the display film 22 and the back film 23.

Figure 4:
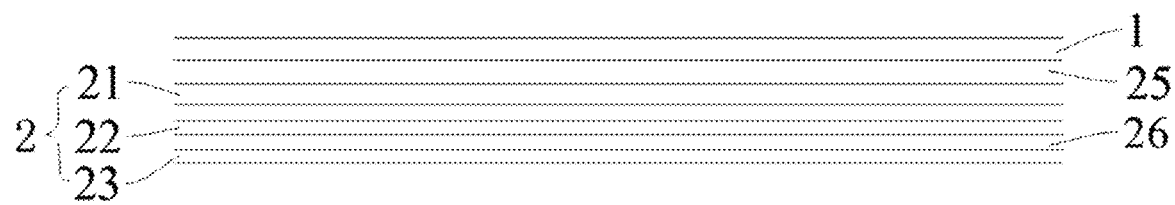
FIG. 4 is a schematic view showing the attachment of a cover plate layer, a polarizer, a display film and a back film according to one embodiment of the present disclosure.

As shown in FIG. 4, adhesive layers are arranged between the cover plate layer 1 and the polarizer 21, between the polarizer 21 and the display film 22, and between the display film 22 and the back film 23, so as to adhere the adjacent layers. The adhesive layer between the cover plate layer 1 and the polarizer 21 is an Optically Clear Adhesive (OCA) 25, and the adhesive layer between the polarizer 21 and the display film 22 and between the display film 22 and the back film 23 is a Pressure Sensitive Adhesive (PSA) 26.

In a possible embodiment of the present disclosure, the OCA 25 has a thickness of 140 μm to 160 μm, and the PSA 26 has a thickness of 15 μm to 20 μm.

Figure 5:
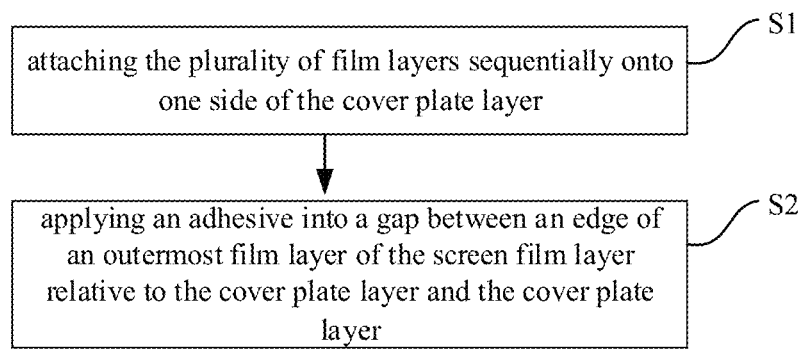
FIG. 5 is a flow chart of a method for forming the flexible display panel according to one embodiment of the present disclosure.

The present disclosure further provides a method for a forming flexible display panel 10. As shown in FIGS. 1 to 4, the flexible display panel 10 includes a cover plate layer 1 and a screen film layer 2, and the screen film layer 2 includes a plurality of film layers. As shown in FIG. 5, the method includes the following steps, i.e., S1 and S2.

S1, attaching the plurality of film layers sequentially onto one side of the cover plate layer.

S2, applying an adhesive into a gap between an edge of an outermost film layer of the screen film layer relative to the cover plate layer and the cover plate layer.

It should be appreciated that a molding process for the flexible display panel may be a general term of the method for forming the flexible display panel.

In some embodiments, subsequent to applying the adhesive into the gap between the edge of the outermost film layer of the screen film layer relative to the cover plate layer and the cover plate layer, the method further includes: bending the cover plate layer and the screen film layer. The bent screen film layer includes a first bending portion and a first non-bending portion, the bent cover plate layer includes a second bending portion and a second non-bending portion, and an edge of the screen film layer and an edge of the cover plate layer are arranged adjacent to the first bending portion of the screen film layer and the second bending portion of the cover plate layer respectively.

In some embodiments, projections of at least two film layers of the plurality of film layers onto the cover plate layer partially overlap each other.

As shown in FIGS. 1 to 4, the screen film layer 2 includes a polarizer 21, a display film 22, a back film 23 and a heat dissipation layer 24 laminated one on another in a direction away from the cover plate layer. The applying the adhesive into the gap between the edge of the outermost film layer of the screen film layer relative to the cover plate layer 1 and the cover plate layer includes: applying the adhesive into a gap between an edge of the heat dissipation layer and the cover plate layer in such a manner that the adhesive covers each of edges of the polarizer, the display film, the back film and the heat dissipation layer.

In some embodiments of the present disclosure, the screen film layer 2 includes a polarizer 21, a display film 22 and a back film 23 laminated one on another in a direction away from the cover plate layer 1. The applying the adhesive into the gap between the edge of the outermost film layer of the screen film layer 2 relative to the cover plate layer 1 and the cover plate layer 1 includes: applying the adhesive into a gap between an edge of the back film 23 and the cover plate layer 1 in such a manner that the adhesive covers each of edges of the polarizer and the display film. The screen film layer further includes a heat dissipation layer 24, and the method further includes attaching the heat dissipation layer 24 onto a side of the back film 23 away from the cover plate layer.

In some embodiments of the present disclosure, the screen film layer 2 includes a polarizer 21, a display film 22 and a back film 23 laminated one on another in a direction away from the cover plate layer. The applying the adhesive into the gap between the edge of the outermost film layer of the screen film layer 2 relative to the cover plate layer 1 and the cover plate layer 1 includes: applying the adhesive into a gap between an edge of the back film and the cover plate layer in such a manner that the adhesive covers an edge of the screen film layer, The screen film layer further includes a heat dissipation layer 24, and the method further includes attaching the heat dissipation layer onto a side of the back film away from the cover plate layer 1 in such a manner that the adhesive 4 is arranged between the heat dissipation layer 24 and the cover plate layer 1.

In other words, the adhesive is applied prior to the attachment of the polarizer, the display film and the back film and subsequent to the attachment of the heat dissipation layer, or subsequent to the attachment of the heat dissipation layer, at each of the edges of the polarizer, the display film, the back film and the heat dissipation layer, or merely at each of the edges of the polarizer, the display film and the back film, or merely at each of the edges of the polarizer and the display film.

According to the method in the embodiments of the present disclosure, the flexible display panel is provided with the adhesive at the edge, and when the resultant flexible display panel is bent, it is able to avoid the occurrence of cracks at the edge, thereby to prevent an encapsulation layer from being damaged. The method is used to obtain the above-mentioned flexible display panel.

After the application of the adhesive, the method further includes S3.

S3, irradiating the adhesive with ultraviolet.

In this way, it is able to cure the adhesive and increase a support capability of the adhesive, thereby to support and protect the edge of the flexible display panel and increase an adhesion strength between the film layers.

Figure 6:
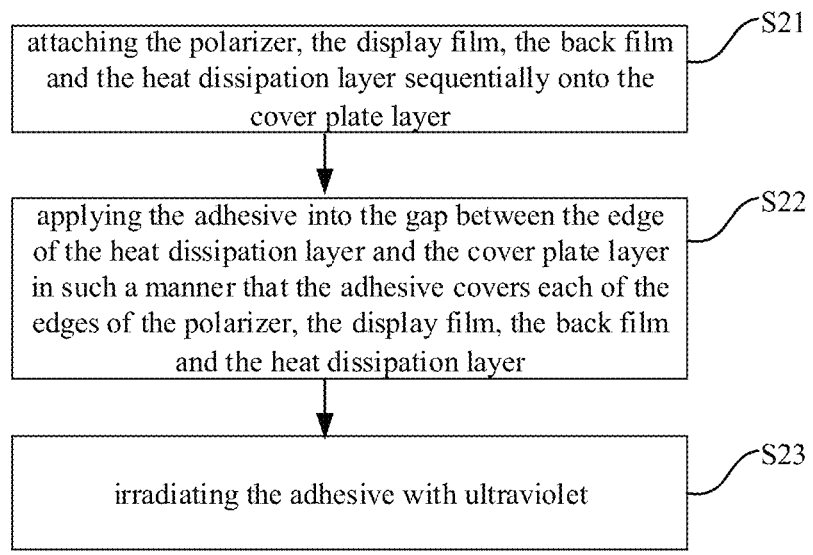
FIG. 6 is another flow chart of the method for forming the flexible display panel according to one embodiment of the present disclosure.

To be specific, as shown in FIG. 6, the method includes the following steps, i.e., S21, S22 and S23.

S21, attaching the polarizer, the display film, the back film and the heat dissipation layer sequentially onto the cover plate layer.

S22, applying the adhesive into the gap between the edge of the heat dissipation layer and the cover plate layer in such a manner that the adhesive covers each of the edges of the polarizer, the display film, the back film and the heat dissipation layer.

S23, irradiating the adhesive with ultraviolet.

In this way, it is able to obtain the flexible display panel in FIG. 1.

Figure 7:
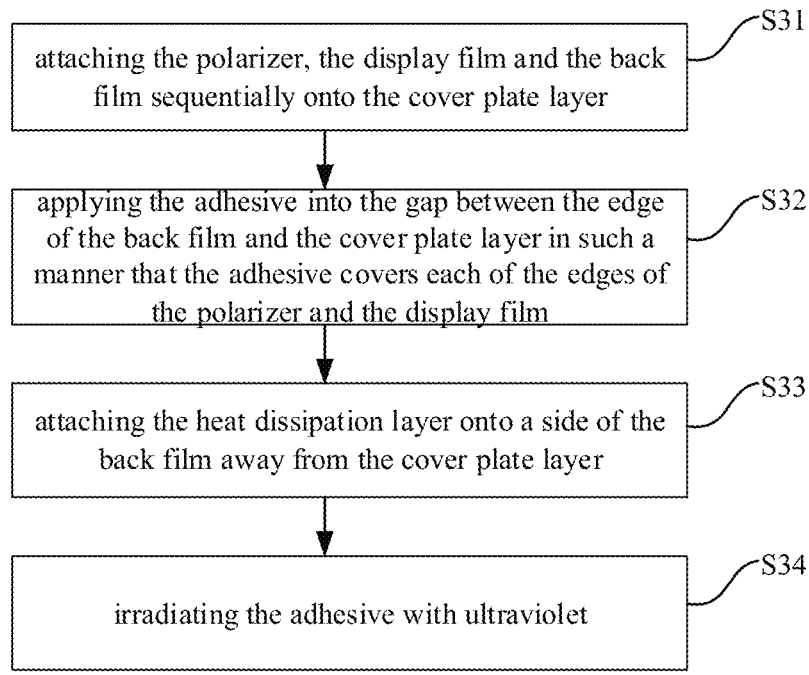
FIG. 7 is yet another flow chart of the method for forming the flexible display panel according to one embodiment of the present disclosure.

As shown in FIG. 7, the method includes the following steps, i.e., S31, S32, S33 and S34.

S31, attaching the polarizer, the display film and the back film sequentially onto the cover plate layer.

S32, applying the adhesive into the gap between the edge of the back film and the cover plate layer in such a manner that the adhesive covers each of the edges of the polarizer and the display film.

S33, attaching the heat dissipation layer onto a side of the back film away from the cover plate layer.

S34, irradiating the adhesive with ultraviolet.

In this way, it is able to obtain the flexible display panel in FIG. 2.

Figure 8:
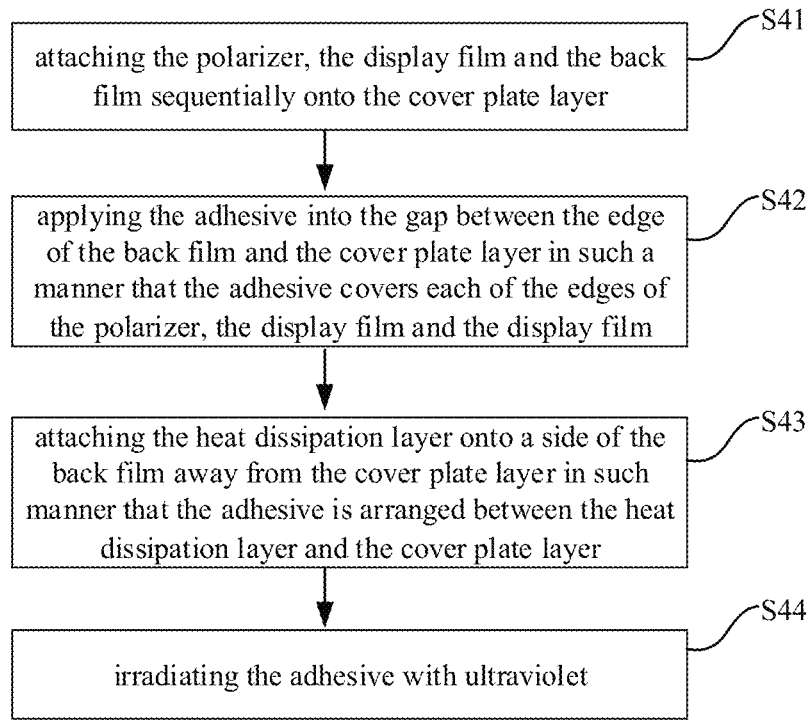
FIG. 8 is still yet another flow chart of the method for forming the flexible display panel according to one embodiment of the present disclosure.

As shown in FIG. 8, the method includes the following steps, i.e., S41, S42, S43 and S44.

S41, attaching the polarizer, the display film and the back film sequentially onto the cover plate layer.

S42, applying the adhesive into the gap between the edge of the back film and the cover plate layer in such a manner that the adhesive covers each of the edges of the polarizer, the display film and the display film.

S43, attaching the heat dissipation layer onto a side of the back film away from the cover plate layer in such manner that the adhesive is arranged between the heat dissipation layer and the cover plate layer.

S44, irradiating the adhesive with ultraviolet.

In this way, it is able to obtain the flexible display panel in FIG. 3.

The present disclosure further provides in some embodiments an adhesive application device for a method for forming a flexible display panel 10. As shown in FIGS. 1 to 4, the flexible display panel 10 includes a cover plate layer 1 and a screen film layer 2, and the screen film layer 2 includes a plurality of film layers laminated one on another at one side of the cover plate layer. As shown in FIGS. 9 to 14, the adhesive application device includes a position capturing unit 201 and an adhesive application mechanism 202. The position capturing unit 201 is configured to obtain position information about an edge of an outermost film layer of the screen film layer 2 relative to the cover plate layer 1 and directly or indirectly transmit the position information to the adhesive application mechanism 202. The adhesive application mechanism 202 is configured to apply an adhesive into a gap between the edge of the outermost film layer of the screen film layer relative to the cover plate layer and the cover plate layer.

To be specific, the adhesive application mechanism 202 includes a nozzle 2021 for applying the adhesive to the edge. The nozzle 2021 of the adhesive application mechanism 202 directly moves to the edge of the screen film layer 2, so as to directly apply the adhesive to the edge. In this way, it is able to solve the problem that it is difficult to apply the adhesive to the edge when a conventional adhesive application mechanism moves in a small space defined by the cover plate layer 1.

According to the adhesive application device in the embodiments of the present disclosure, the position information about the edge of an outermost film layer of the screen film layer 2 relative to the cover plate layer 1 is obtained by the position capturing unit 201, and then the adhesive is applied to the edge by the adhesive application mechanism 202 in accordance with the position information. As a result, it is able to obtain the flexible display panel 10 having the adhesive 4 at the edge, and prevent the occurrence of cracks at the edge when the resultant flexible display panel 10 is bent, thereby to prevent an encapsulation layer from being damaged.

The adhesive application device in the embodiments of the present disclosure is used to implement the above-mentioned method, so as to obtain the above-mentioned flexible display panel 10. In addition, through obtaining the position information about the edge of the outermost film layer of the screen film layer 2 relative to the cover plate layer 1 by the position capturing unit 201, it is able to simplify an adhesive application process.

Figure 9:
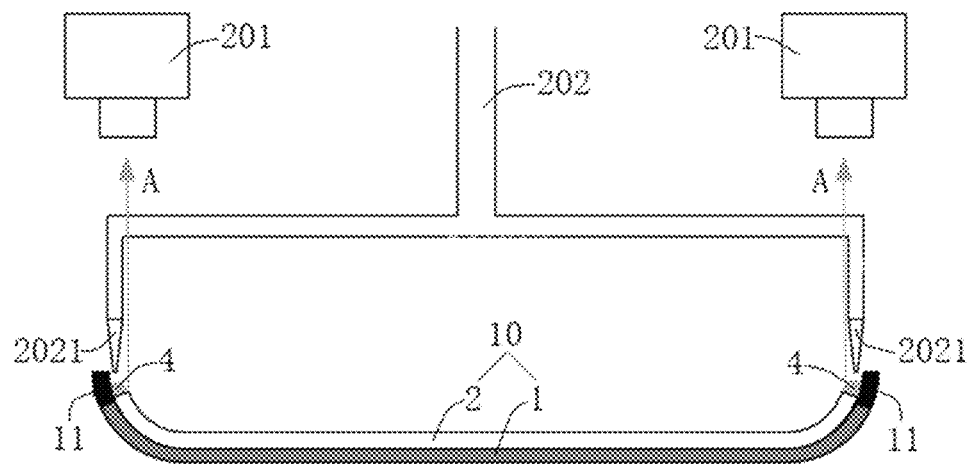
FIG. 9 is a schematic view showing an adhesive application device for the method for forming the flexible display panel according to one embodiment of the present disclosure.
Figure 10:
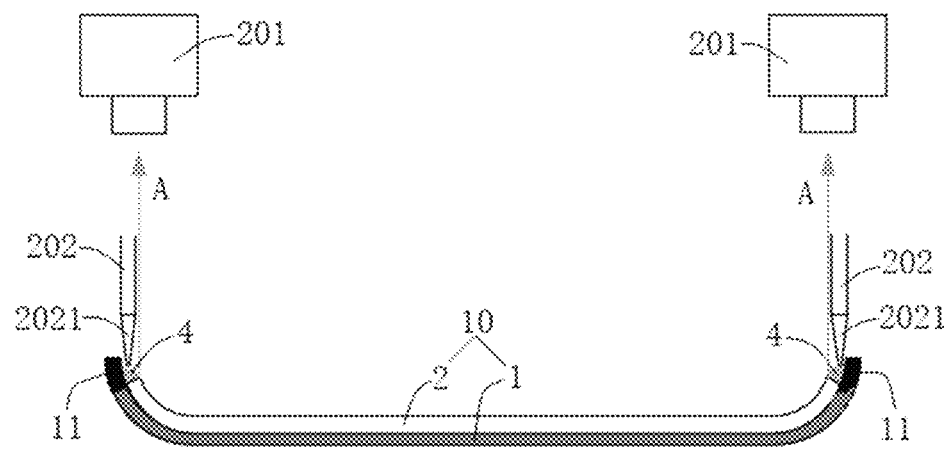
FIG. 10 is another schematic view showing the adhesive application device according to one embodiment of the present disclosure.

As shown in FIGS. 9 and 10, when a bending angle at a bending portion of the flexible display panel 10 is smaller than or equal to 90°, the position capturing unit 201 is directly aligned with the edge of the screen film layer 2 to capture the position information about the edge of the screen film layer.

In other words, when the bending angle at the bending portion of the flexible display panel 10 is smaller than or equal to 90° (i.e., a flexible screen is arranged horizontally or curved at a small angle), the edge of the screen film layer 2 is easily captured by the position capturing unit 201 directly, so the adhesive is applied in a simple manner.

Figure 18:
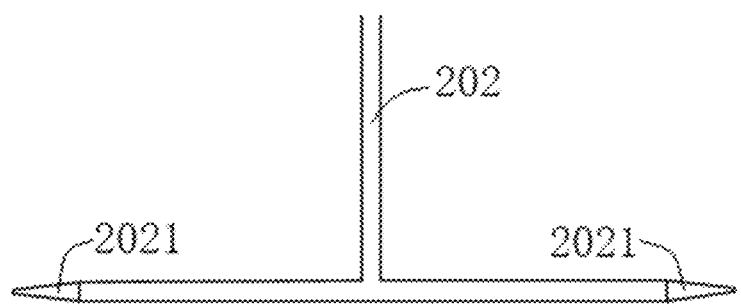
FIG. 18 is a schematic view showing a one-piece adhesive application mechanism according to one embodiment of the present disclosure.
Figure 20:
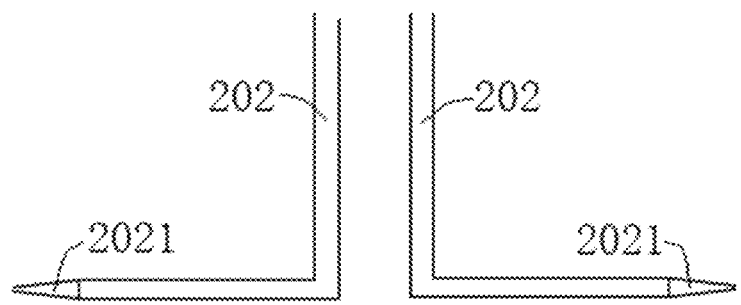
FIG. 20 is a schematic view showing a split-type adhesive application mechanism according to one embodiment of the present disclosure.

For the flexible display panel 10 having the bending angle smaller than or equal to 90° at the bending portion, during the application of the adhesive, an opening of the cover plate layer 1 faces upward, and the position capturing unit 201 is directly arranged above the edge of the screen film layer 2 to capture the position information about the edge of the outermost film layer of the screen film layer 2 relative to the cover plate layer 1. A represents an optical path. The adhesive application mechanism 202 has a structure as shown in FIGS. 9 to 10 to directly apply the adhesive to the edge of the screen film layer 2 in a vertical direction, or has a structure as shown in FIGS. 18 and 20 to apply the adhesive to the edge of the screen film layer in a horizontal direction.

Figure 11:
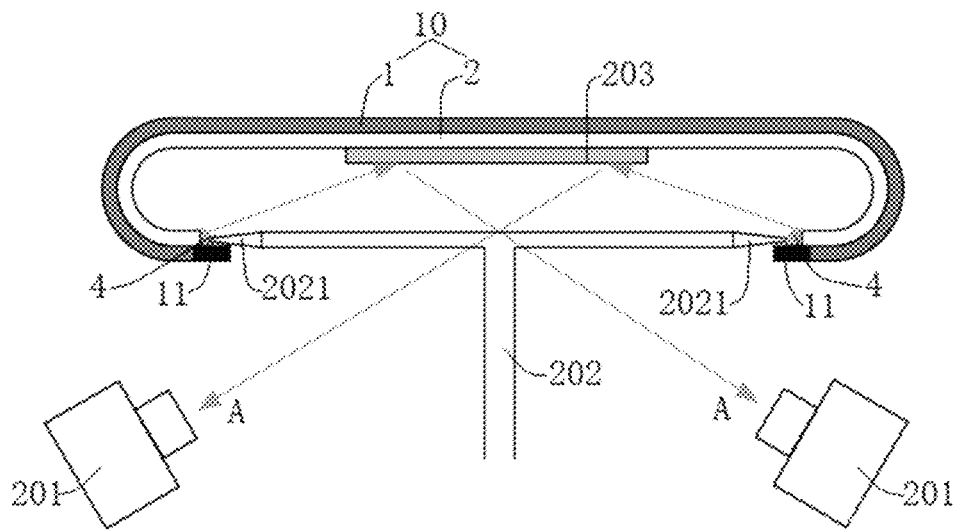
FIG. 11 is yet another schematic view showing the adhesive application device according to one embodiment of the present disclosure.
Figure 12:
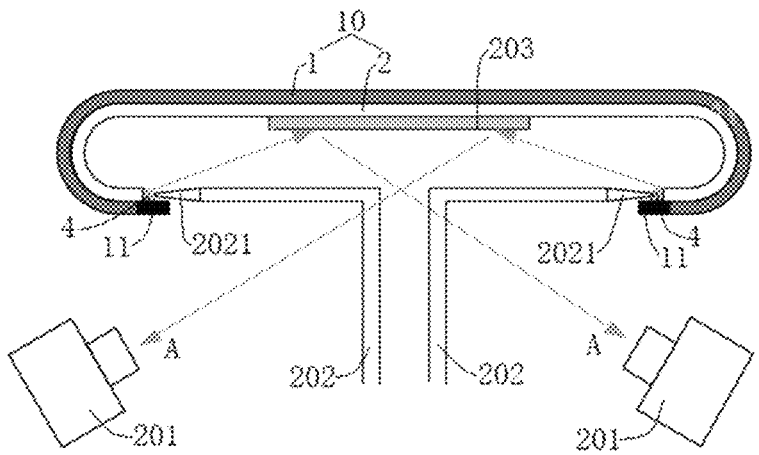
FIG. 12 is still yet another schematic view showing the adhesive application device according to one embodiment of the present disclosure.

As shown in FIGS. 11 and 12, when the bending angle at the bending portion of the flexible display panel 10 is 180°, the position capturing unit 201 is configured to capture the position information about the edge of the outermost film layer of the screen film layer 2 relative to the cover plate layer 1 through a reflector 203.

In other words, when the bending angle at the bending portion of the flexible display panel 10 is 180°, the edge of the screen film layer 2 is easily shielded by ink 11 on the cover plate layer 1 or a planar portion of the cover plate layer 1, so it is difficult for the position capturing unit 201 to directly capture the edge of the screen film layer 2. At this time, it is necessary to capture the edge of the screen film layer 2 through the reflector 203.

Figure 19:
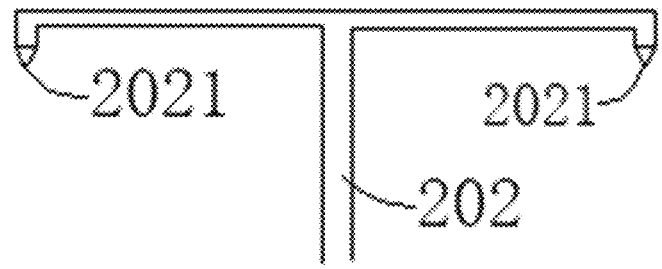
FIG. 19 is another schematic view showing the one-piece adhesive application mechanism according to one embodiment of the present disclosure.
Figure 21:
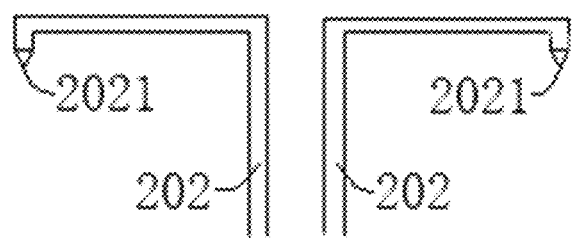
FIG. 21 is another schematic view showing the split-type adhesive application mechanism according to one embodiment of the present disclosure.

For the flexible display panel 10 having the bending angle of 180° at the bending portion, during the application of the adhesive, the opening of the cover plate layer 1 faces downward, and the position capturing unit 201 captures the position information about the edge of the outermost film layer of the screen film layer 2 relative to the cover plate layer 1 through the reflector 203. The position capturing unit 201 on the right is configured to capture a left edge of the screen film layer 2, and the position capturing unit 201 on the left is configured to capture a right edge of the screen film layer 2. A represents an optical path. The adhesive application mechanism 202 has a structure as shown in FIGS. 11 and 12 to apply the adhesive to the edge of the screen film layer 2 in the horizontal direction, or has a structure as shown in FIGS. 19 and 21 to directly apply the adhesive to the edge of the screen film layer in the vertical direction.

Figure 13:
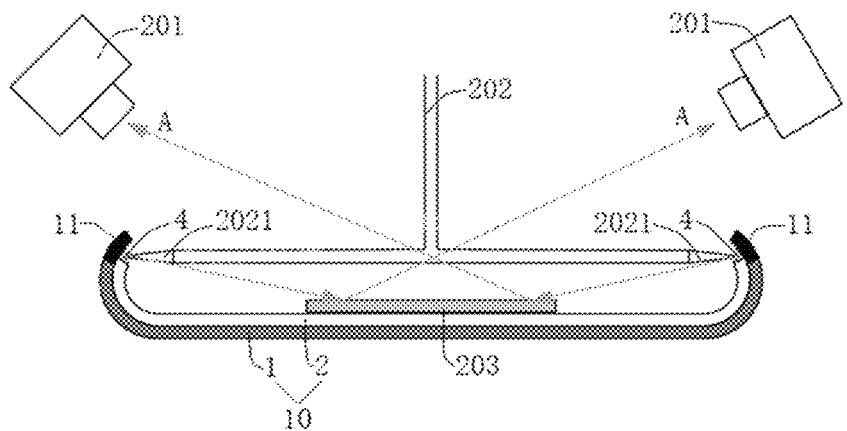
FIG. 13 is still yet another schematic view showing the adhesive application device according to one embodiment of the present disclosure.
Figure 14:
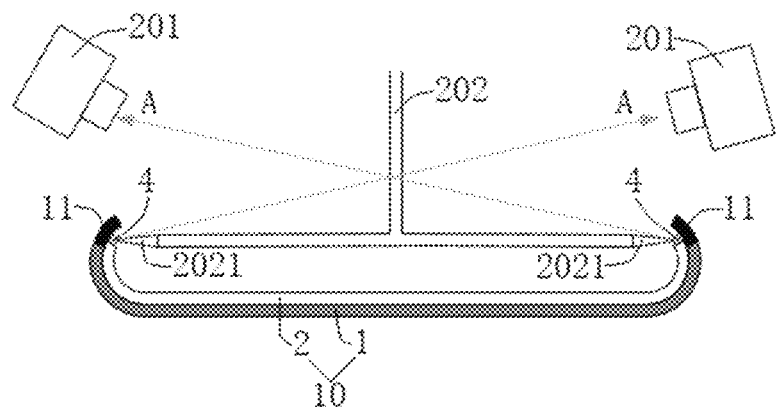
FIG. 14 is still yet another schematic view showing the adhesive application device according to one embodiment of the present disclosure.

As shown in FIGS. 13 and 14, when the bending angle at the bending portion of the flexible display panel 10 is greater than 90° and smaller than 180°, the position capturing unit 201 is directly aligned with the edge of the screen film layer 2 to capture the position information about the edge of the outermost film layer of the screen film layer 2 relative to the cover plate layer 1, or the position capturing unit 201 is configured to capture the position information about the edge of the outermost film layer of the screen film layer 2 relative to the cover plate layer 1 through the reflector 203.

To be specific, when the bending angle at the bending portion approximates to 90°, the position capturing unit 201 is directly aligned with the edge of the screen film layer 2 to capture the position information about the edge of the outermost film layer of the screen film layer 2 relative to the cover plate layer 1. The position capturing units 201 are arranged in such a manner that the position capturing unit 201 on the right captures the left edge of the screen film layer 2 and the position capturing unit 201 on the left captures the right edge of the screen film layer 2. When the bending angle at the bending portion approximates to 180°, the position capturing unit 201 captures the position information about the edge of the outermost film layer of the screen film layer 2 relative to the cover plate layer 1 through the reflector 203. Identically, the position capturing unit 201 on the right captures the left edge of the screen film layer 2, and the position capturing unit 201 on the left captures the right edge of the screen film layer 2.

For the flexible display panel 10 having the bending angle greater than 90° and smaller than 180° at the bending portion (i.e., the flexible display panel 10 is bent at a large angle), during the application of the adhesive, the opening of the cover plate layer 1 faces upward, and the position capturing unit 201 captures the position information about the edge of the outermost film layer of the screen film layer 2 relative to the cover plate layer 1 through the reflector 203 (as shown in FIG. 13), or the position capturing units 201 are arranged in such a manner that the position capturing unit 201 on the right captures the left edge of the screen film layer 2 and the position capturing unit 201 on the left captures the right edge of the screen film layer 2 (as shown in FIG. 14). A represents an optical path. The adhesive application mechanism 202 has a one-piece structure as shown in FIGS. 13 and 14 to apply the adhesive to the edge of the screen film layer 2 in the horizontal direction, or has a split-type structure as shown in FIG. 20 to apply the adhesive to the edge of the screen film layer in the horizontal direction.

The opening of the cover plate layer is arranged as shown in FIGS. 9 to 14, so as to store the adhesive between the edge of the screen and the cover plate layer 1, and allow the adhesive to flow into the gap at the edge of the screen. Of course, in some other embodiments of the present disclosure, the opening of the cover plate layer 1 may also be arranged obliquely. In addition, the adhesive 4 is arranged above the ink 11, so an illumination effect of the flexible display panel 10 is not adversely affected.

In a possible embodiment of the present disclosure, the reflector 203 has a planar or curved surface, or a surface having at least two linear portions.

Figure 15:
FIG. 15 is a schematic view showing a reflector with a curved surface according to one embodiment of the present disclosure.
Figure 16:
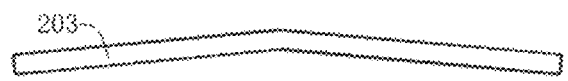
FIG. 16 is a schematic view showing the reflector with a surface having two linear portions according to one embodiment of the present disclosure.
Figure 17:
FIG. 17 is a schematic view showing the reflector with a surface having more than two linear portions according to one embodiment of the present disclosure.

For example, as shown in FIGS. 11 to 13, the reflector 203 has a planar surface; as shown in FIG. 15, the reflector 203 has a curved surface; as shown in FIG. 16, the reflector 203 has a surface having two linear portions; and as shown in FIG. 17, the reflector 203 has a surface having more than two linear portions.

In a possible embodiment of the present disclosure, the adhesive application mechanism 202 is a one-piece or split-type mechanism.

For example, as shown in FIGS. 9, 11, 13-14 and 18-19, the adhesive application mechanism 202 is a one-piece mechanism; and as shown in FIGS. 10, 12 and 20-21 is a split-type mechanism. The adhesive application mechanism 202 in FIG. 9 may also be replaced with the adhesive application mechanism 202 in FIG. 18, the adhesive application mechanism 202 in FIG. 10 may also be replaced with the adhesive application mechanism 202 in FIG. 20, the adhesive application mechanism 202 in FIG. 11 may also be replaced with the adhesive application mechanism 202 in FIG. 19, and the adhesive application mechanism 202 in FIG. 12 may also be replaced with the adhesive application mechanism 202 in FIG. 21.

The adhesive is an ultraviolet (UV)-curable adhesive. After the application, the adhesive is irradiated with UV, so as to be cured. The UV curing process may be performed simultaneously with a curing process of the OCA 24.

According to the adhesive application device in the embodiments of the present disclosure, for a small bending angle, the position capturing unit 201 directly captures the edge of the screen film layer 2, and for a large bending angle, the position capturing unit 201 captures the edge of the screen film layer 2 through the reflector 203, so it is able to accurately apply the adhesive to the edge of the screen film layer 2.

It should be further appreciated that, such phrases as "one embodiment", "some embodiments", "an example", "a specific example" or "some examples" intend to indicate that the features, structures, materials or characteristics are contained in at least one embodiment of the present disclosure, rather than referring to a same embodiment. In addition, the features, structures, materials or characteristics may be combined in any embodiment or embodiments in an appropriate manner.

The above embodiments are for illustrative purposes only, but the present disclosure is not limited thereto. Apparently, a person skilled in the art may make further modifications and improvements without departing from the spirit of the present disclosure, and these modifications and improvements shall also fall within the scope of the present disclosure.

What is claimed is:

1. A flexible display panel, comprising a cover plate layer and a screen film layer, wherein the screen film layer comprises a plurality of film layers laminated one on another at one side of the cover plate layer, and an adhesive is filled into a gap between an edge of an outermost film layer of the screen film layer relative to the cover plate layer and the cover plate layer;
wherein the screen film layer comprises a polarizer, a display film, a back film and a heat dissipation layer sequentially laminated one on another onto the cover plate layer in a direction away from the cover plate layer, and the adhesive covers each of edges of the polarizer, the display film, the back film and the heat dissipation layer;
wherein the polarizer, the display film, the back film and the heat dissipation layer each comprise a first bending portion and a first non-bending portion, the cover plate layer comprises a second bending portion and a second non-bending portion, and an edge of the screen film layer and an edge of the cover plate layer are arranged adjacent to the first bending portion of the screen film layer and the second bending portion of the cover plate layer respectively.

2. The flexible display panel according to claim 1, wherein projections of at least two film layers of the plurality of film layers onto the cover plate layer partially overlap each other.

3. The flexible display panel according to claim 1, wherein in a case where the screen film layer comprises a polarizer, a display film and a back film laminated one on another in a direction away from the cover plate layer, and the adhesive is arranged between the back film and the cover plate layer and covers each of edges of the polarizer and the display film.

4. The flexible display panel according to claim 1, wherein in a case where the screen film layer comprises a polarizer, a display film, a back film and a heat dissipation layer laminated one on another in a direction away from the cover plate layer, and the adhesive is arranged between the heat dissipation layer and the cover plate layer and covers each of edges of the polarizer, the display film and the back film.

5. A method for forming a flexible display panel, wherein the flexible display panel comprises a cover plate layer and a screen film layer, and the screen film layer comprises a plurality of film layers, wherein the method comprises:
attaching the plurality of film layers sequentially onto one side of the cover plate layer; and applying an adhesive into a gap between an edge of an outermost film layer of the screen film layer relative to the cover plate layer and the cover plate layer;

wherein the screen film layer comprises a polarizer, a display film, a back film and a heat dissipation layer sequentially laminated one on another onto the cover plate layer in a direction away from the cover plate layer, prior to applying the adhesive into the gap between the edge of the outermost film layer of the screen film layer relative to the cover plate layer and the cover plate layer, the method further comprises:

bending the cover plate layer and the screen film layer, wherein the polarizer, the display film, the back film and the heat dissipation layer each comprise a first bending portion and a first non-bending portion, the bent cover plate layer comprises a second bending portion and a second non-bending portion, and an edge of the screen film layer and an edge of the cover plate layer are arranged adjacent to the first bending portion of the screen film layer and the second bending portion of the cover plate layer respectively;

wherein the applying the adhesive into the gap between the edge of the outermost film layer of the screen film layer relative to the cover plate layer and the cover plate layer comprises:

applying the adhesive into a gap between an edge of the heat dissipation layer and the cover plate layer in such a manner that the adhesive covers each of edges of the polarizer, the display film, the back film and the heat dissipation layer.

6. The method according to claim 5, wherein projections of at least two film layers of the plurality of film layers onto the cover plate layer partially overlap each other.

7. The method according to claim 5, wherein in a case where the screen film layer comprises a polarizer, a display film and a back film laminated one on another in a direction away from the cover plate layer, wherein the applying the adhesive into the gap between the edge of the outermost film layer of the screen film layer relative to the cover plate layer and the cover plate layer comprises: applying the adhesive into a gap between an edge of the back film and the cover plate layer in such a manner that the adhesive covers each of edges of the polarizer and the display film;

wherein the screen film layer further comprises a heat dissipation layer, and the method further comprises attaching the heat dissipation layer onto a side of the back film away from the cover plate layer.

8. The method according to claim 5, wherein in a case where the screen film layer comprises a polarizer, a display film and a back film laminated one on another in a direction away from the cover plate layer, wherein the applying the adhesive into the gap between the edge of the outermost film layer of the screen film layer relative to the cover plate layer and the cover plate layer comprises: applying the adhesive into a gap between an edge of the back film and the cover plate layer in such a manner that the adhesive covers each of edges of the polarizer, the display film and the back film;

wherein the screen film layer further comprises a heat dissipation layer, and the method further comprises attaching the heat dissipation layer onto a side of the back film away from the cover plate layer in such a manner that the adhesive is arranged between the heat dissipation layer and the cover plate layer.

9. The method according to claim 5, wherein after the application of the adhesive, the method further comprises irradiating the adhesive with ultraviolet.

10. An adhesive application device for a method for forming a flexible display panel, wherein the flexible display panel comprises a cover plate layer and a screen film layer, and the screen film layer comprises a plurality of film layers laminated one on another at one side of the cover plate layer, wherein the adhesive application device comprises a position capturing unit and an adhesive application mechanism, the position capturing unit is configured to obtain position information about an edge of an outermost film layer of the screen film layer relative to the cover plate layer and directly or indirectly transmit the position information to the adhesive application mechanism, and the adhesive application mechanism is configured to apply an adhesive into a gap between the edge of the outermost film layer of the screen film layer relative to the cover plate layer and the cover plate layer;

wherein the screen film layer comprises a polarizer, a display film, a back film and a heat dissipation layer sequentially laminated one on another onto the cover plate layer in a direction away from the cover plate layer, and the adhesive covers each of edges of the polarizer, the display film, the back film and the heat dissipation layer;

wherein the polarizer, the display film, the back film and the heat dissipation layer each comprise a first bending portion and a first non-bending portion, the cover plate layer comprises a second bending portion and a second non-bending portion, and an edge of the screen film layer and an edge of the cover plate layer are arranged adjacent to the first bending portion of the screen film layer and the second bending portion of the cover plate layer respectively.

11. The adhesive application device according to claim 10, wherein when a bending angle at a bending portion of the flexible display panel is smaller than or equal to 90°, the position capturing unit is directly aligned with the edge of the outermost film layer of the screen film layer relative to the cover plate layer to capture the position information about the edge of the outermost film layer of the screen film layer relative to the cover plate layer.

12. The adhesive application device according to claim 10, wherein when a bending angle at a bending portion of the flexible display panel is 180°, the position capturing unit is configured to capture the position information about the edge of the outermost film layer of the screen film layer relative to the cover plate layer through a reflector.

13. The adhesive application device according to claim 10, wherein when a bending angle at a bending portion of the flexible display panel is greater than 90° and smaller than 180°, the position capturing unit is directly aligned with the edge of the screen film layer to capture the position information about the edge of the outermost film layer of the screen film layer relative to the cover plate layer, or the position capturing unit is configured to capture the position information about the edge of the outermost film layer of the screen film layer relative to the cover plate layer through a reflector.

14. The adhesive application device according to claim 12, wherein the reflector has a planar or curved surface, or a surface having at least two linear portions.

15. The adhesive application device according to claim 10, wherein the adhesive application mechanism is a one-piece or split-type mechanism.

\* \* \* \* \*